(12) United States Patent
Chang et al.

(10) Patent No.: US 12,087,378 B2
(45) Date of Patent: *Sep. 10, 2024

(54) BIT SELECTION FOR POWER REDUCTION IN STACKING STRUCTURE DURING MEMORY PROGRAMMING

(71) Applicant: Taiwan Semiconductor Manufacturing Company, Ltd., Hsinchu (TW)

(72) Inventors: Meng-Sheng Chang, Hsinchu (TW); Yoshitaka Yamauchi, Hsinchu (TW); Perng-Fei Yuh, Walnut Creek, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/318,000

(22) Filed: May 16, 2023

(65) Prior Publication Data

US 2023/0282297 A1    Sep. 7, 2023

Related U.S. Application Data

(63) Continuation of application No. 17/557,268, filed on Dec. 21, 2021, now Pat. No. 11,664,081.

(60) Provisional application No. 63/175,200, filed on Apr. 15, 2021.

(51) Int. Cl.
*G11C 17/18* (2006.01)
*G11C 17/16* (2006.01)
*H03K 19/20* (2006.01)

(52) U.S. Cl.
CPC .............. *G11C 17/18* (2013.01); *G11C 17/16* (2013.01); *H03K 19/20* (2013.01)

(58) Field of Classification Search
CPC ......... G11C 17/18; G11C 17/16; H03K 19/20
USPC .......................................................... 365/96
See application file for complete search history.

(56) References Cited

U.S. PATENT DOCUMENTS

| | | | |
|---|---|---|---|
| 7,468,929 B2 | 12/2008 | Lee et al. | |
| 11,664,081 B2* | 5/2023 | Chang .................... | G11C 17/18 365/96 |
| 2009/0244955 A1* | 10/2009 | Sasaki .................. | G11C 11/412 365/230.06 |

* cited by examiner

*Primary Examiner* — Huan Hoang
(74) *Attorney, Agent, or Firm* — Jones Day (57) ABSTRACT

Systems, devices, and methods are described herein for a programmable memory array. A programmable memory system includes an array of programmable memory bit cells. A memory bit cell of the array includes a first transistor of a first type controlled by a bit line, a second transistor of a second type responsive to a first word line and a second word line via a logic gate, and a third transistor of the second type responsive to the word line. The first word line is positioned substantially perpendicular to the bit line, and the second word line is positioned substantially parallel to the bit line. The first word line is activated via an X portion of an address. While the second word line is activated via a Y portion of the address.

20 Claims, 6 Drawing Sheets

BIT SELECTION FOR POWER REDUCTION IN STACKING STRUCTURE DURING MEMORY PROGRAMMING

PRIORITY CLAIM

The present application is a continuation of U.S. patent application Ser. No. 17/557,268, filed Dec. 21, 2021, which claims priority to U.S. Provisional Patent Application 63/175,200, filed Apr. 15, 2021, the contents of each of which is incorporated by reference herein in their entirety.

FIELD

The technology described in this disclosure relates generally to bit selection for power reduction in stacking structure during memory programming.

BACKGROUND

Non-volatile memory devices are used to store data in modern integrated circuits and find widespread applications in a variety of electronic devices. For example, non-volatile memory devices include a memory cell operable so as to store a bit, i.e., "1" or "0", of data therein. One-time-programmable (OTP) memory is one type of non-volatile memory that can be programmed once to store information that is not to be subsequently changed. In another example, non-volatile memory can include a fuse unit that contains a fuse. In one example, when the fuse is blown or programmed, a bit, e.g., "1" is stored in the memory cell. Otherwise, i.e., when the fuse is left intact or un-programmed, a bit, e.g., "0", is stored in the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

A memory array is made up a number of individual memory bit cells oriented in rows along bit lines and columns along word lines. The memory bit cells can be programmed to store either a "0" or a "1". Programming of memory bit cells within a memory array can consume large amounts of power due to unnecessary activation of electrical components within the array. For example, in order to program a particular memory bit cell within a particular row, the entire row is activated to program one memory bit cell within that row. Through the incorporation of a logic gate into each memory bit cell and second word lines oriented substantially perpendicular to bit line within the memory array as described in detail herein, individual memory bit cells can be programmed without activating an entire row and/or column in which the memory bit cell is located. This can save power consumption during programming mode as electrical components within the array are no longer unnecessarily activated.

Figure 1:
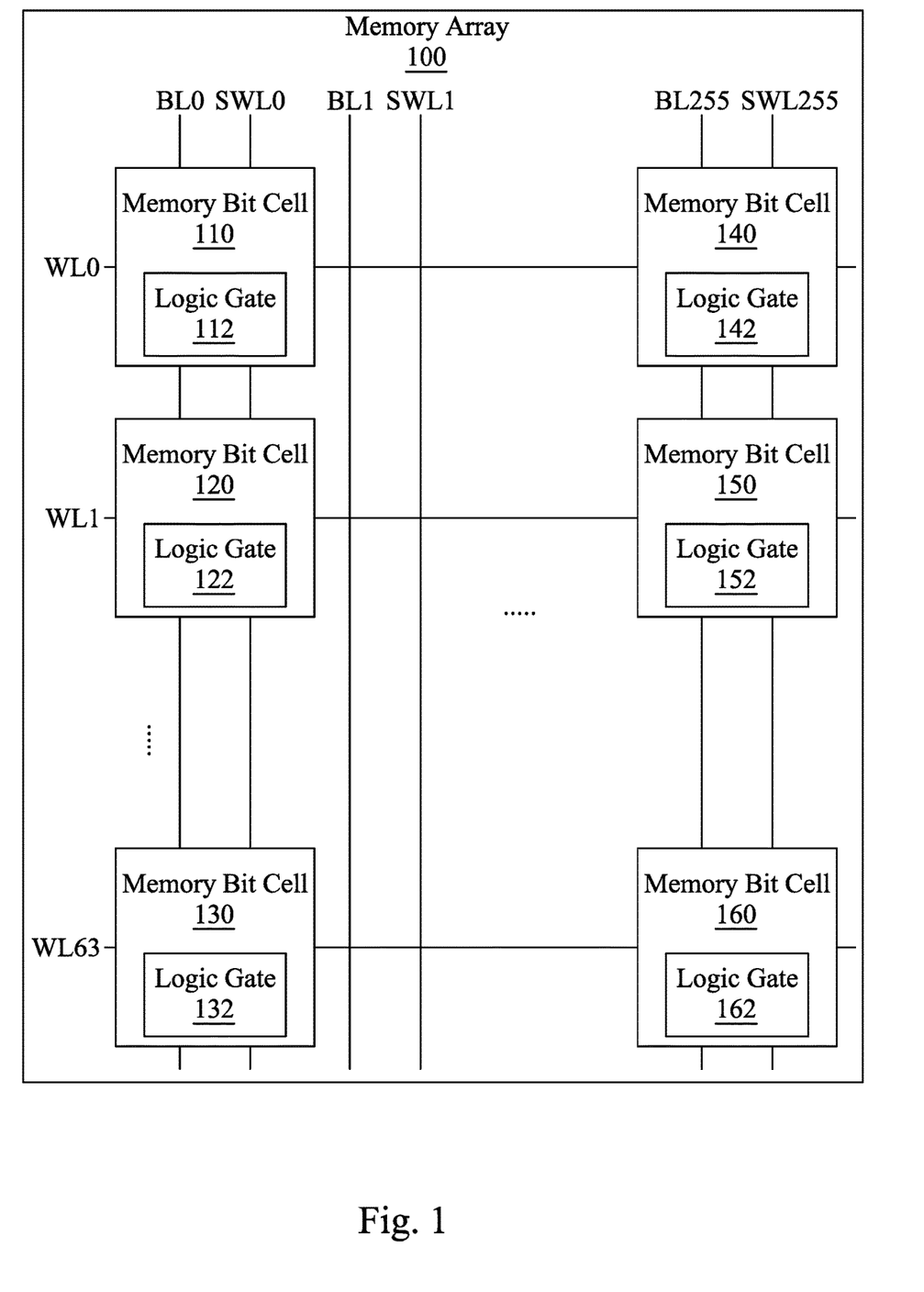
FIG. 1 is a block diagram illustrating an example memory array in accordance with various embodiments of the present invention.

FIG. 1 is a block diagram illustrating an example memory array 100 in accordance with various embodiments of the present invention. The memory array 100 includes a number of memory bits cells 110, 120, 130, 140, 150, 160. Each memory bit cell is configured to store a bit of memory (e.g., a '1' bit or a '0' bit). Storing a bit of memory to the memory array 100 is known as programming memory or sometimes referred to as programming mode. This storage occurs based on an address provided to the bit lines (e.g., BL0, BL63), word lines (e.g., WL0, WL63), and second word lines (e.g., SWL0, SWL255), as explained in more detail in FIGS. 2-5.

The address identifies an X, Y location (e.g., location of a row and a column) within a memory bit cell that a particular bit should be written.

As illustrated in FIG. 1, each memory cell 110, 120, 130, 140, 150, 160 is coupled to a bit line (e.g., BL0, BL255), a word line (e.g., WL0, WL63), and a second word line (e.g., SWL0, SWL255). The second word lines (e.g., SWL0, SWL255) are oriented substantially perpendicular to the word lines (e.g., WL0, WL63) and substantially parallel to the bit lines (e.g., BL0, BL255). Each word line (e.g., WL0, WL63) and second word line (e.g., SWL0, SWL255) is coupled to a logic gate (e.g., logic gate 112, 122, 132, 142, 152, 162) within each memory bit cell 110, 120, 130, 140, 150, 160. In order to write a bit to a specific memory bit cell within the memory array 100, portions of an address are provided to the bit lines (e.g., BL0, ..., BL63), word lines (e.g., WL0, ..., WL63), and second word lines (e.g., SWL0, ..., SWL255). Each logic gate 112, 122, 132, 142, 152, 162 compares whether both the word line and second word line include signals (e.g., address portions). If signals are present on both the word line and the second world line, the respective logic gate activates electrical components (e.g., one or more transistors) within the respective memory bit cell and the data is written to that memory bit cell. This activation is described in more detail in FIGS. 3-4. The presence of the logic gate combined with the second word line orientation facilitates individual selection of a specific memory bit cell from the memory array 100. This can avoid the need to activate an entire row and/or column when the memory array 100 is in programming mode. This minimal activation of a specific memory bit cell, rather than an entire row or column, can save power during programming mode as power is applied to a single memory bit cell (or a combination of specific memory bits cells) rather than a larger number of memory bit cells in the row or column of the memory array 100.

As illustrated in FIG. 1, memory bit cell 110 is coupled to bit line 0 (e.g., BL0), word line 0 (e.g., WL0), and second word line 0 (e.g., SWL0). Second word line 0 (e.g., SWL0) is substantially parallel to bit line 0 (e.g., BL0) and substantially perpendicular to word line 0 (e.g., WL0). In that same column, both memory bit cells 120 and 130 are also coupled to bit line 0 (e.g., BL0) and second word line 0 (e.g., SWL0). Similarly, memory bit cell 140 is in the same row as memory bit cell 110. Memory bit cell 140 is coupled to bit line 255 (e.g., BL255), word line 0 (e.g., WL0), and second word line 255 (e.g., SW255). Second word line 255 (e.g., SWL255) is substantially parallel to bit line 255 (e.g., BL255) and substantially perpendicular to word line 0 (e.g., WL0). In the same column as memory bit cell 140, both memory bit cells 150 and 160 are coupled to bit line 255 (e.g., BL255) and second word line 255 (e.g., SWL255). Memory bit cell 150, being in the same row as memory bit cell 120, is coupled to word line 1 (e.g., WL1). Second word line 255 (e.g., SWL255) is substantially perpendicular to word line 1 (e.g., WL1). Memory bit cell 160, being in the same row as memory bit cell 130, is coupled to word line 63 (e.g., WL63). Second word line 255 (e.g., SWL255) is substantially perpendicular to word line 63 (e.g., WL63).

Although only a few memory bit cells are illustrated in FIG. 1, it can be appreciated that each combination of bit line, word line, and second word line intersection is coupled to a memory bit cell. Similarly, although only a few bit lines, word lines, and second word lines are illustrated in FIG. 1, it can be appreciated that memory array 100 includes sixty-four word lines, two-hundred fifty-six bit lines, and two-hundred fifty-six second world lines. Additionally, the memory array 100 is not constrained to a size of 64 word lines×256 bit lines and can be any number of word lines and any number of bit lines.

Figure 2:
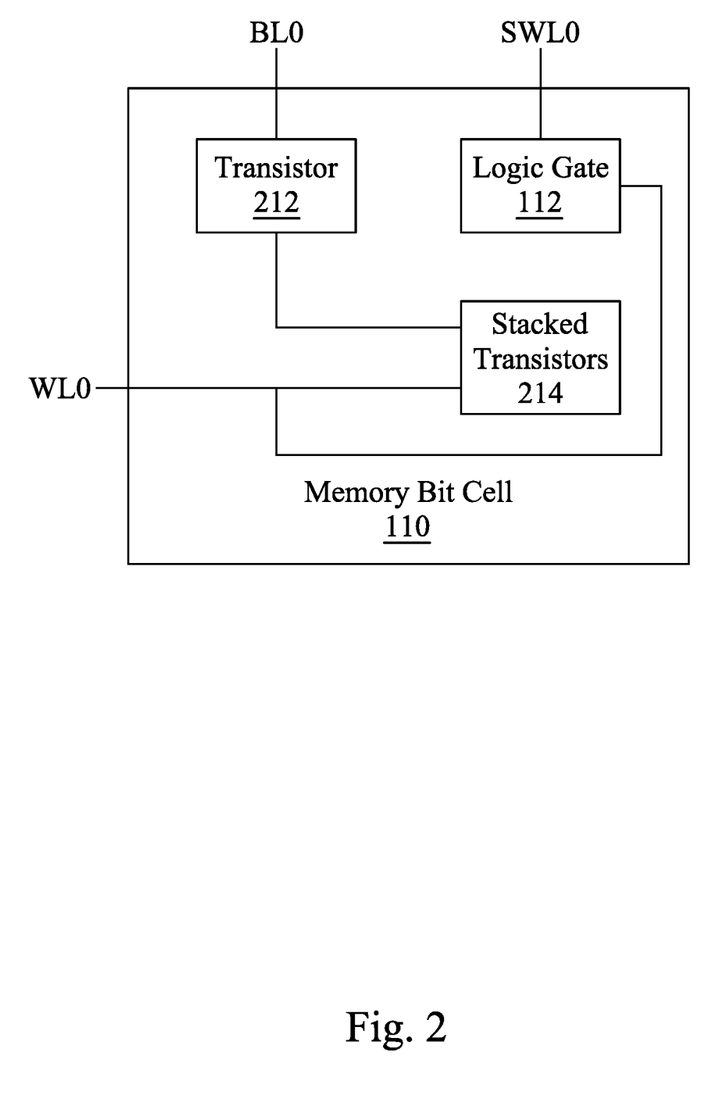
FIG. 2 is a block diagram illustrating an example memory bit cell in accordance with various embodiments of the present disclosure.

FIG. 2 is a block diagram illustrating an example memory bit cell 110 in accordance with various embodiments of the present disclosure. Memory bit cell 110 includes a logic gate 112, a transistor 212, and stacked transistors 214. As previously discussed in FIG. 1, portions of an address are provided to the bit line 0 (e.g., BL0), word line 0 (e.g., WL0), and second word line 0 (e.g., SWL0). The address identifies an X, Y location (e.g., location of a row and a column) within a memory bit cell that a particular bit should be written. More specifically, bit line 0 receives a portion of an address (e.g., Y portion of the address) for writing data to a particular memory bit cell in the memory array 100. This portion of the address controls the operation of the transistor 212, which is coupled to bit line 0 (e.g., 0). If memory bit cell 110 is located in the same address location as the Y portion of the address indicates, then the transistor 212 is operational. Otherwise, transistor 212 is not operational. The transistor 212 is of a first type (e.g., P-type or N-type). The transistor 212 is coupled to stacked transistors 214.

Stacked transistors 214 are also coupled to logic gate 112. Logic gate 112 is coupled to both the second word line 0 (e.g., SWL0) and word line 0 (e.g., WL0) in the example of FIG. 2. Similar to bit line 0 (e.g., BL0), second word line 0 (e.g., SWL0) receives a portion of an address (e.g., Y portion of the address) for writing data to a particular memory bit cell in the memory array 100. The logic gate 112 facilitates individual selection of the memory bit cell 110 from memory array 100 by evaluating for the presence of both the Y address portion received from the second word line 0 (e.g., SWL0) and the X address portion received from the word line 0 (e.g., WL0). If both address portions are present (e.g., X address portion and Y address portion), the logic gate 112 activates the stacked transistors 214, as explained in more detail in FIG. 3. Otherwise, the stacked transistors 214 remain in an off state (e.g., not operational). The stacked transistors 214 are of a second type (e.g., P-type or N-type) that is opposite the first type. For example, if the first type of transistor 212 is a P-type transistor (e.g., PMOS), then the stacked transistors 214 include N-type transistors (e.g., NMOS) and vice versa. This is illustrated further in FIGS. 3-4.

Figure 3:
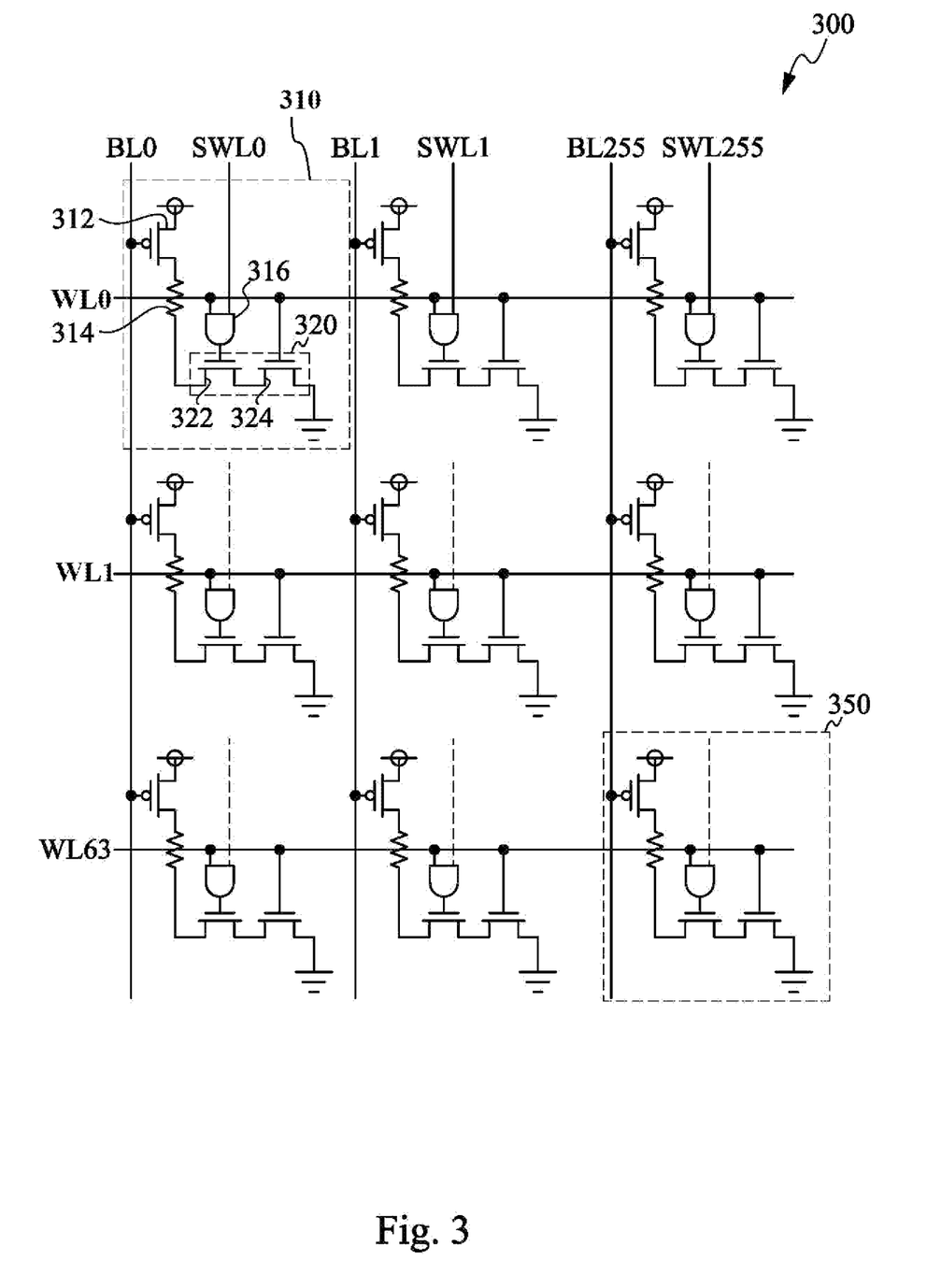
FIG. 3 is an electrical schematic illustrating an example memory array in accordance with various embodiments of the present disclosure.

FIG. 3 is an electrical schematic illustrating an example memory array 300 in accordance with various embodiments of the present disclosure. Memory array 300 illustrates electrical components within memory array 100 of FIG. 1. Memory array 300 includes a number of memory bit cells, such as memory bit cell 310. Memory bit cell 310 includes transistor 312, logic gate 316, and stacked transistors 320. In the example illustrated in FIG. 3, transistor 312 is a P-type (e.g., PMOS) transistor and the stacked transistors 320 include two N-type (e.g., NMOS) transistors 322, 324. Memory bit cell 310 can optionally include electrical fuse (eFuse) 314. EFuses are usually integrated into semiconductor ICs by using a narrow strip commonly called a "fuse link" of conducting material (e.g., metal, poly-silicon, etc.) between two pads, generally referred to as anode and cathode. Applying a programing current to the eFuse destroys (i.e., fuses) the link, thus changing the resistivity of the eFuse. This is referred to as "programming" the eFuse. The fuse state (i.e., whether it has been programmed) can be read using a sensing circuit.

A gate of the transistor 312 is coupled to the bit line 0 (e.g., BL0). Transistor 312 is activated (or operational) based on the presence of a signal (e.g., Y portion of an address) on the bit line 0 (e.g., BL0). A source/drain terminal of transistor 312 is coupled to a driving voltage, VDD. Another source/drain terminal of transistor 312 is coupled to eFuse 314. The eFuse 314 is also coupled to stacked transistors 320. More specifically, to a source/drain terminal of transistor 322.

Stacked transistors 320 are activated based on the presence of both an X address portion on word line (e.g., WL0) and a Y address portion on the bit line (e.g., BL0) and second word line (e.g., SWL0). More specifically, logic gate 316 evaluates the presence of signals (e.g., address portions) on its input terminals. An input terminal of logic gate 316 is coupled to the word line (e.g., WL0) and another input terminal of logic gate 316 is coupled to the second word line (e.g., SWL0). If an address portion is present on both of the input terminals of logic gate 316, it outputs a logic high (e.g., '1') to the gate terminal of transistor 322 (e.g., the gate terminal to which logic gate 316 is coupled) thereby activating the transistor 322. A source/drain terminal of transistor 322 is coupled to a source/drain terminal of transistor 324. A gate terminal of transistor 324 is coupled to the word line (e.g., WL0) and activates based on the presence of an address portion on the word line (e.g., WL0). As illustrated in FIG. 3, a source/drain terminal of transistor 324 is also coupled to electrical ground. Through this described operation, memory bit cell 310 will individually activate based on the presence of both an X address portion and a Y address portion. This means that any other bit cells within the same row/column will not activate during programming. Absent one or both of these address portions, the memory bit cell 310 remains off during programming mode of memory array 300.

Although operation of a single memory bit cell was discussed in detail relative to FIG. 3, it can be appreciated that each memory bit cell within memory array 300 operates in a similar manner, albeit having different bit line, word line, and second word line signals. For example, activation of memory bit cell 350 is based on the presence of an X address portion along word line 63 (e.g., WL63) and a Y address portion along bit line 255 (e.g., BL255) and second word line 255 (e.g., WL255). Operations of the electrical components within memory bit cell 350 are similar to those as described above in relation to memory bit cell 310. Additionally, logic gate 316 is illustrated as an AND gate. It can be appreciated that any combination of logic elements that results in a similar operation to an AND gate can be used, such as a NAND gate coupled to an inverter.

Figure 4:
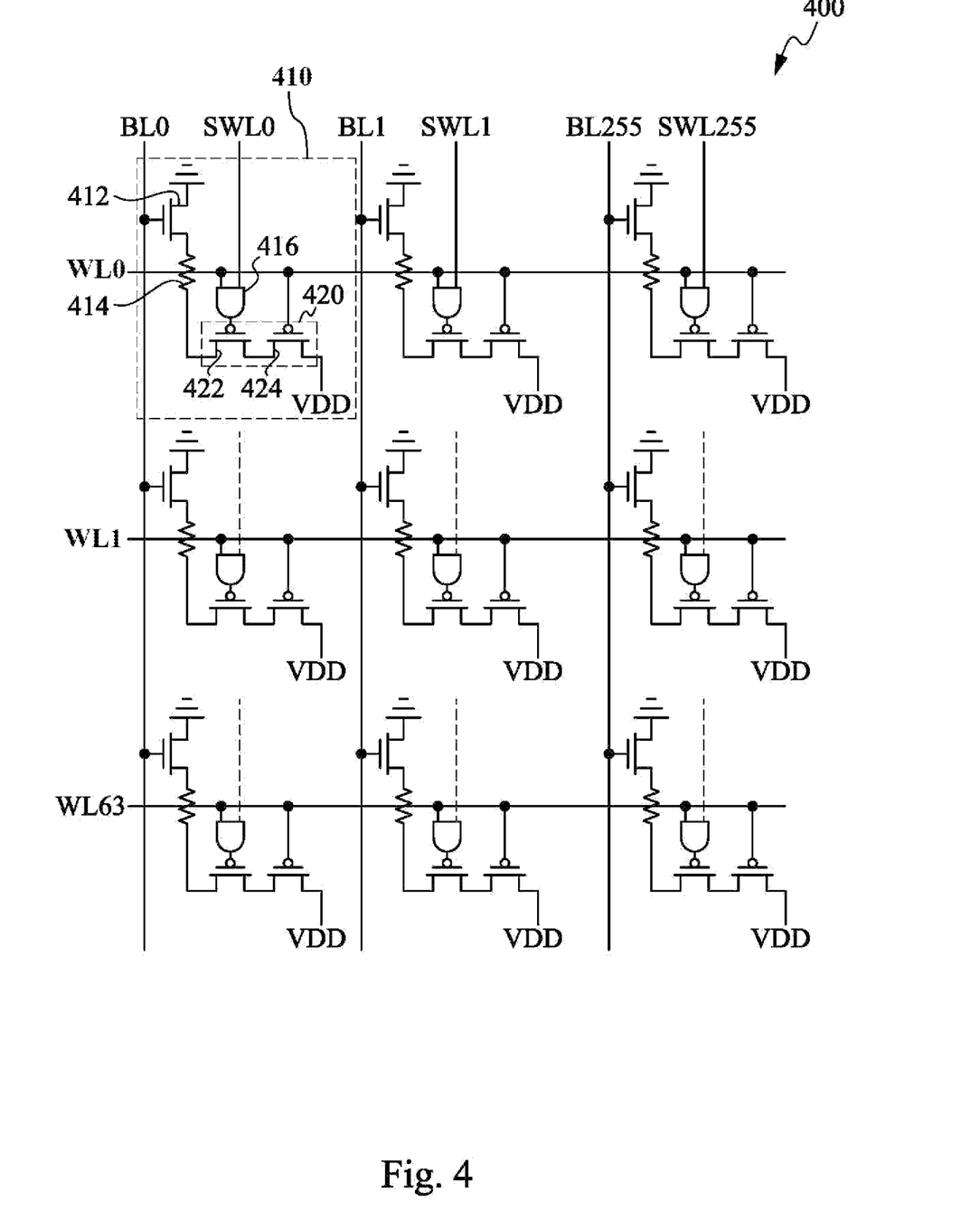
FIG. 4 is an electrical schematic illustrating another example memory array in accordance with various embodiments of the present disclosure.

FIG. 4 is an electrical schematic illustrating another example memory array 400 in accordance with various embodiments of the present disclosure. The operation of memory array 400 is similar to that of memory array 300 described in FIG. 3. The memory array 400 differs from that of memory array 300 in the types of transistors used within each memory bit cell. For example, memory array 400 include memory bit cell 410. Memory bit cell 410 includes transistor 412, eFuse 414, logic gate 416, and stacked transistors 420. In this example, transistor 412 is an N-type (e.g., NMOS) transistor, rather than the P-type (e.g., PMOS) transistor described in FIG. 3. Stacked transistors 420 include two P-type (e.g., PMOS) transistors 422, 424, rather than the N-type (e.g., NMOS) transistors described in FIG. 3. The changing of transistors modifies the electrical coupling within memory bit cell 410 in a couple ways. First, a source/drain terminal of transistor 412 is coupled to ground, rather than a driving voltage, VDD. Second, a source/drain terminal of transistor 424 is coupled to the driving voltage, VDD, rather than ground. All other operations of memory bit cell 410 remain similar to those described in relation to memory bit cell 310 in FIG. 3.

Figure 5:
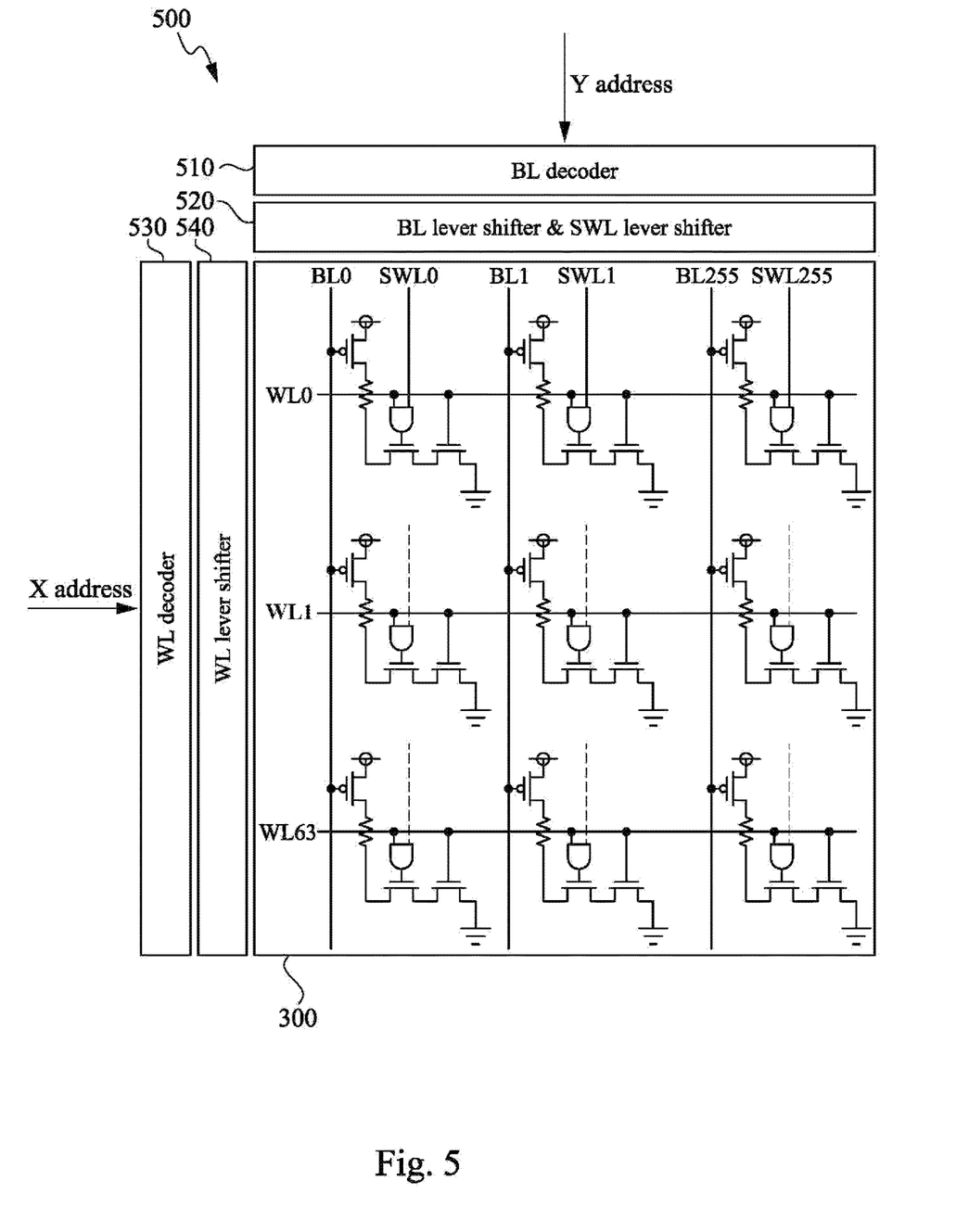
FIG. 5 is a block diagram illustrating an example programmable memory system in accordance with various embodiments of the present disclosure.

FIG. 5 is a block diagram illustrating an example programmable memory system 500 in accordance with various embodiments of the present disclosure. Memory array 500 includes memory array 300 previously described in FIG. 3. The programmable memory system 500 includes a bit line decoder 510, a bit line level shifter and second word line level shifter 520, a word line decoder 530, a word line level shifter 540, and a memory array 300. The word line decoder 530 is configured to receive an X portion of an address (e.g., a row address signal) and enables a particular word line (e.g., WL0 through WL63) to select a particular row of memory bit cells. The word line level shifter 540 "levels up" a voltage (e.g., increases) to a particular level needed to activate the row of memory bit cells. The row selection and increased voltage are provided to a particular word line input of memory array 300. Similarly, bit line decoder 510 is configured to receive a Y address portion (e.g., column address signal) and enables a particular bit line to activate the column of memory bit cells. The bit line level shifter and second word line level shifter 520 each "level up" a voltage (e.g., increases) to a particular level needed to activate the column of memory bit cells. The column selection and increased voltage are provided to a particular bit line and second word line input of memory array 300. Memory array 300 utilizes this input as described in FIG. 3. Although FIG. 5 illustrates the use of memory array 300 within the programmable memory system 500, it can be appreciated that memory array 400 can also be used within said system.

Figure 6:
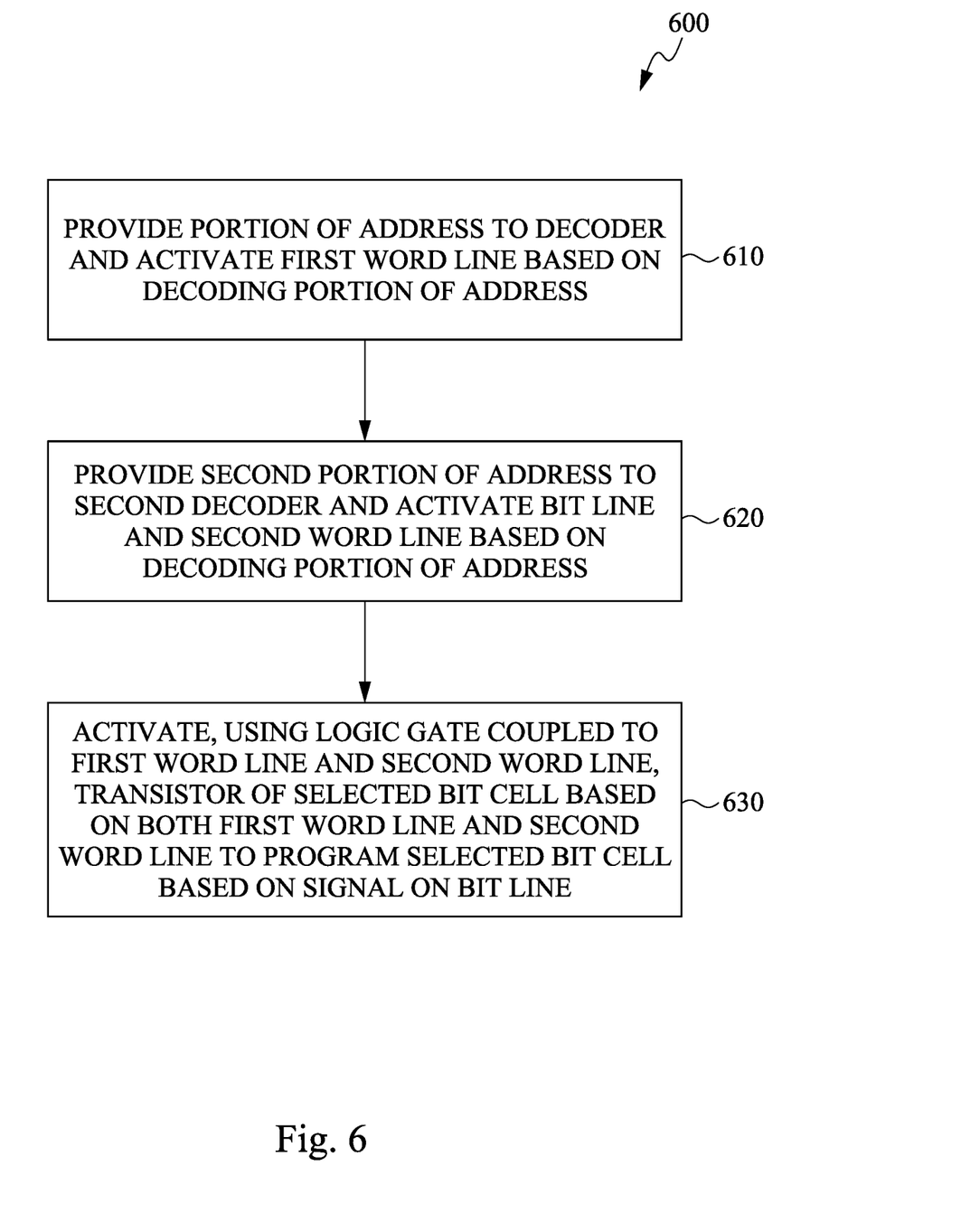
FIG. 6 is a process flow diagram illustrating method of controlling a programmable memory.

FIG. 6 is a process flow diagram 600 illustrating method of controlling a programmable memory. While FIG. 6 is described here with reference to previously described structures for ease in understanding, it is understood that the method applies to many other structures as well. A memory bit cell 310 of a programmable memory 300 is programmed by providing a portion of an address (e.g., X address portion) to a decoder (e.g., WL decoder 530) and activating a first word line (e.g., WL within memory array 300) based on decoding the portion of the address (e.g., step 610). A second portion of the address (e.g., Y address portion) is provided to a second decoder (e.g., BL decoder 510) and activates a bit line (e.g., BL0) and a second word line (e.g., SWL0) based on decoding the portion of the address (e.g., step 620). The bit line (e.g., BL0) and the second word line (e.g., SWL0) are substantially perpendicular to the first word line (e.g., WL0) over a portion of the programmable memory 300. Using a logic gate (e.g., 316) coupled to the first word line (e.g., WL0) and the second word line (e.g., SWL0), a transistor (e.g., 322) of a selected bit cell (e.g., memory bit cell 310) is activated based on both the first word line (e.g., WL0) and the second word line (e.g., SWL0) to program the selected bit cell (e.g., memory bit cell 310) based on a signal on the bit line (e.g., X address portion and Y address portion) (e.g., step 630).

Use of the various circuits and methods as described herein can provide a number of advantages. For example, the use of the memory array described herein can reduce the amount of active power used by the array during programming mode. The use of a second word line that is substantially parallel to the bit line along with the logic gate coupled to both the word line and second word line allows for individual selection of a single memory bit cell within the array, rather than activation of an entire row or column containing that memory bit cell. It is the combination of the second word line and the logic gate within the memory array and bit cell that facilitates this individualized activation of a single memory bit cell. The individual activation of a single memory bit cell (or multiple memory bit cells depending upon the use case) reduces the capacitive loading of the array, which in turn reduces overall power utilized by the array.

In one embodiment, a memory bit cell includes a bit line configured to receive a Y portion of an address, a first word line oriented substantially perpendicular to the bit line, a second word line oriented substantially perpendicular to the first word line and substantially parallel to the bit line, a logic gate coupled to the second word line configured to evaluate presence of both the Y portion of the address and an X portion of the address, a stack of first transistors of a first type coupled to the first word line, and a second transistor of a second type coupled to the bit line. The first word line is configured to receive the X portion of the address. The second word line is configured to receive the Y portion of the address. The stack of first transistors are configured to be activated based on the presence of both the Y portion of the address and the X portion of the address evaluated by the logic gate. The second transistor is configured to be activated based on the Y portion of the address.

In another embodiment, a programmable memory system includes an array of programmable memory bit cells. A memory bit cell of the array includes a first transistor of a first type controlled by a bit line, a second transistor of a second type responsive to a first word line and a second word line via a logic gate, and a third transistor of the second type responsive to the first word line. The first word line is activated via an X portion of an address. The first word line is positioned substantially perpendicular to the bit line, and a second word line is positioned substantially parallel to the bit line. The second word line is activated via both the X portion of the address and a Y portion of the address.

In yet another embodiment, a method of controlling a programmable memory includes programming a bit cell of a programmable memory. Such programming occurs by first providing a first portion of an address to a decoder and activating a first word line based on decoding the first portion of the address. A second portion of the address is provided to a second decoder and causing activation of a bit line and a second word line based on decoding a second portion of the address. The bit line and the second word line are substantially perpendicular to the word line over a portion of the programmable memory. Using a logic gate coupled to the first word line and the second word line, a transistor of a selected bit cell is activated based on both the first word line and the second word line to program the selected bit cell based on a signal on the bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory bit cell comprising:
a bit line configured to receive a Y portion of an address;
a first word line configured to receive an X portion of the address;
a second word line configured to receive the Y portion of the address;
a stack of first transistors configured to be activated based on the presence of both the Y portion of the address and the X portion of the address; and
a second transistor configured to be activated based on the Y portion of the address, wherein a source/drain terminal of the second transistor is responsive to common node that a source/drain terminal of one of the stack of first transistors is also responsive to.

2. The memory bit cell of claim 1, further comprising a logic gate configured to facilitate selection of the memory bit cell.

3. The memory bit cell of claim 2, wherein the logic gate comprises an AND gate or an NAND gate.

4. The memory bit cell of claim 2, wherein the stack of first transistors comprises at least two transistors and a gate of a transistor of the stack of first transistors is coupled to a first input of the logic gate and the second word line is coupled to another input of the logic gate.

5. The memory bit cell of claim 2, wherein a gate of a transistor of the stack of first transistors is coupled to an output of the logic gate.

6. The memory bit cell of claim 1, wherein at least one of the stack of first transistors is of a first type, the second transistor is of a second type, the first type is one of a P-type and an N-type, and the second type is the other of the P-type and the N-type.

7. A system comprising:
an array of memory bit cells, wherein a memory bit cell of the array of memory bit cells comprises:
a first transistor controlled by a bit line;
a second transistor responsive to a first word line and a second word line; and
a third transistor responsive to the first word line.

8. The system of claim 7, further comprising a logic gate configured to facilitate selection of the memory bit cell.

9. The system of claim 8, wherein the logic gate comprises an AND gate or an NAND gate.

10. The system of claim 8, wherein a gate of the third transistor is coupled to a first input of the logic gate and the second word line is coupled to another input of the logic gate.

11. The system of claim 8, wherein a gate of second transistor is coupled to an output of the logic gate.

12. The system of claim 7, wherein the first transistor is of a first type and at least one of the second and transistors is of a second type, the first type is one of an N-type and a P-type, and the second type is the other of the N-type and the P-type.

13. The system of claim 7, further comprising:
a word line decoder; and
a word line level shifter coupled to the word line decoder and the first word line, wherein the X portion of the address is provided to the word line decoder.

14. The system of claim 7, further comprising:
a bit line decoder;
a bit line level shifter coupled to the bit line decoder, the bit line, and the second word line; and
a second word line level shifter coupled to the bit line decoder, the bit line, and the second word line, wherein the Y portion of the address is provided to the bit line decoder.

15. A method comprising:
programming a bit cell of a memory by:

providing a first portion of an address to a decoder and activating a first word line based on decoding the first portion of the address;

providing a second portion of the address to a second decoder and activating a bit line and a second word line based on decoding the second portion of the address; and activating a transistor of a bit cell based on the first word line and the second word line to program the bit cell based on a signal on the bit line.

16. The method of claim 15, wherein the bit cell includes a logic gate configured to facilitate selection thereof.

17. The method of claim 16, wherein the logic gate comprises an AND gate or a NAND gate.

18. The method of claim 16, wherein a gate of the transistor is coupled to an output of the logic gate.

19. The method of claim 15, wherein the transistor is a PMOS transistor or an NMOS transistor.

20. The method of claim 15, wherein the first decoder is a word line decoder and the second decoder is a bit line decoder.

\* \* \* \* \*